(12) United States Patent
Bader et al.

(10) Patent No.: US 6,849,878 B2
(45) Date of Patent: Feb. 1, 2005

(54) METHOD FOR FABRICATING A RADIATION-EMITTING SEMICONDUCTOR CHIP BASED ON III-V NITRIDE SEMICONDUCTOR, AND RADIATION-EMITTING SEMICONDUCTOR CHIP

(75) Inventors: Stefan Bader, Sinzing (DE); Michael Fehrer, Bad Abbach (DE); Berthold Hahn, Hemau (DE); Volker Härle, Waldetzenberg (DE); Hans-Jürgen Lugauer, Sinzing (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 31 days.

(21) Appl. No.: 10/377,363

(22) Filed: Feb. 28, 2003

(65) Prior Publication Data

US 2003/0197170 A1 Oct. 23, 2003

Related U.S. Application Data

(63) Continuation of application No. PCT/DE01/03348, filed on Aug. 31, 2001.

(30) Foreign Application Priority Data

Aug. 31, 2000 (DE) .......................................... 100 42 947

(51) Int. Cl.⁷ ............................................... H01L 33/00

(52) U.S. Cl. ....................... 257/103; 257/101; 257/102; 257/79; 257/80; 257/81; 257/94

(58) Field of Search .................................. 257/103, 101, 257/102, 79, 80, 81, 94

(56) References Cited

U.S. PATENT DOCUMENTS

| | | | |
|---|---|---|---|
| 5,585,648 | A | 12/1996 | Tischler |
| 5,679,152 | A | 10/1997 | Tischler et al. |
| 5,739,554 | A | 4/1998 | Edmond et al. |
| 5,786,606 | A | 7/1998 | Nishio et al. |
| 5,798,537 | A | 8/1998 | Nitta |
| 5,851,905 | A | 12/1998 | McIntosh et al. |
| 5,874,747 | A | 2/1999 | Redwing et al. |

(List continued on next page.)

FOREIGN PATENT DOCUMENTS

| | | |
|---|---|---|
| DE | 100 00 088 A1 | 8/2000 |
| EP | 0 356 037 A2 | 2/1990 |
| JP | 10 215 035 A | 8/1998 |
| JP | 11 068 157 A | 3/1999 |
| JP | 11 145 516 | 5/1999 |

OTHER PUBLICATIONS

Manfred von Ardenne: "Tabellen zur angewandten Physik" [tables for applied physics], VEB Verlag der Wissenschaften, Berlin, vol. III, 1973, pp. 168–169.

(List continued on next page.)

Primary Examiner—Nathan J. Flynn
Assistant Examiner—Remmon R. Fordé
(74) Attorney, Agent, or Firm—Laurence A. Greenberg; Werner H. Stemer; Gregory L. Mayback

(57) ABSTRACT

A method for fabricating a radiation-emitting semiconductor chip having a thin-film element based on III–V nitride semiconductor material includes the steps of depositing a layer sequence of a thin-film element on an epitaxy substrate. The thin-film element is joined to a carrier, and the epitaxy substrate is removed from the thin-film element. The epitaxy substrate has a substrate body made from PolySiC or PolyGaN or from SiC, GaN or sapphire, which is joined to a grown-on layer by a bonding layer, and on which the layer sequence of the thin-film element is deposited by epitaxy.

7 Claims, 3 Drawing Sheets

U.S. PATENT DOCUMENTS

| | | | |
|---|---|---|---|
| 5,985,687 A | | 11/1999 | Bowers et al. |
| 6,046,464 A | | 4/2000 | Schetzina |
| 6,599,133 B2 | * | 7/2003 | Nikolaev et al. ............. 438/22 |
| 6,630,690 B2 | * | 10/2003 | Edmond et al. .............. 257/79 |
| 6,630,695 B2 | * | 10/2003 | Chen et al. ................. 257/190 |
| 6,646,292 B2 | * | 11/2003 | Steigerwald et al. ........ 257/103 |
| 6,696,704 B1 | * | 2/2004 | Maeda et al. ................. 257/98 |

OTHER PUBLICATIONS

Ishikawa, H. et al.: "GaN on Si Substrate with AlGaN/AlN Intermediate Layer", Publication Board, Japanese Journal of Applied Physics, vol. 38, Part 2, No. 5A, May 1, 1999, pp. L492–L494.

* cited by examiner

METHOD FOR FABRICATING A RADIATION-EMITTING SEMICONDUCTOR CHIP BASED ON III-V NITRIDE SEMICONDUCTOR, AND RADIATION-EMITTING SEMICONDUCTOR CHIP

CROSS-REFERENCE TO RELATED APPLICATION

This application is a continuation of copending International Application No. PCT/DE01/03348, filed Aug. 31, 2001, which designated the United States and was not published in English.

BACKGROUND OF THE INVENTION

Field of the Invention

The invention relates to a method for fabricating a radiation-emitting semiconductor chip based on III-V nitride semiconductor material. In the method a layer sequence of a thin-film element is deposited on an epitaxy substrate. The thin-film element is joined to a carrier and the epitaxy substrate is removed from the thin-film element.

Radiation-emitting semiconductor components based on GaN are known, for example, from U.S. Pat. No. 5,874,747. Semiconductor components of this type include a semiconductor body having a plurality of layers that consist of GaN or a material based thereon. According to the document cited, the plurality of GaN-based layers is applied to an SiC substrate.

In the present context, the term III-V nitride semiconductor materials encompasses the materials derived from GaN or related to GaN and mixed crystals which are based on these materials, for example ternary or quaternary mixed crystals. In particular, the term encompasses the materials AlN, InN, AlGaN ($Al_{1-x}Ga_xN$, $0 \leq x \leq 1$), InGaN ($In_{1-x}Ga_xN$, $0 \leq x \leq 1$), InAlN ($In_{1-x}Al_xN$, $0 \leq x \leq 1$) and AlInGaN ($Al_{1-x-y}In_xGa_yN$, $0 \leq x \leq 1$, $0 \leq y \leq 1$).

In the text that follows, the term "III-V nitride semiconductor material" relates to the group of materials described above. Furthermore, this term also includes materials which are used to form buffer layers in the epitaxial fabrication of layers belonging to the materials systems described.

Furthermore, it is known from U.S. Pat. No. 5,679,152 to fabricate GaN-based semiconductor bodies by epitaxy on a suitable substrate, for example an Si substrate, the substrate being removed in situ following the epitaxial deposition of GaN layers.

U.S. Pat. No. 5,786,606 discloses GaN-based semiconductor bodies that have an intermediate SiC substrate that is formed on the original epitaxy substrate. The original substrate body is removed during fabrication.

The use of semiconductor bodies which include a SiC substrate entails additional, not inconsiderable costs for the fabrication of semiconductor components, since SiC substrates themselves are extremely expensive. If, for each semiconductor body based on III-V nitride semiconductor materials, parts of the SiC substrate are incorporated in a semiconductor component, the costs of the semiconductor component are directly linked to the costs of the SiC substrate. This makes low-cost fabrication of the semiconductor component more difficult.

Furthermore, an SiC substrate in semiconductor chips based on III-V nitride semiconductors can lead to a reduction in the radiation yield, since SiC partially absorbs the radiation which they emit and thereby reduces the amount of radiation which can be discharged.

The fabrication method using Si substrates that is described in U.S. Pat. No. 5,679,152 can only use very thin substrates which have to be removed immediately after the epitaxy. The permissible thickness of such substrates is typically less than 1 μm.

These thin substrates are required in order to avoid the formation of cracks in the semiconductor body on account of the different coefficients of thermal expansion between silicon and materials based on III-V nitride semiconductors.

SUMMARY OF THE INVENTION

It is accordingly an object of the invention to provide a method for fabricating a radiation-emitting semiconductor chip based on III-V nitride semiconductor, and a radiation-emitting semiconductor chip that overcome the above-mentioned disadvantages of the prior art methods and devices of this general type, which is technically simple and therefore inexpensive to produce and has a high external quantum efficiency.

With the foregoing and other objects in view there is provided, in accordance with the invention, a method for fabricating a radiation-emitting semiconductor chip. The method includes providing an epitaxy substrate having a substrate body made from PolySiC or PolyGaN, a bonding layer disposed on the substrate body, and a grown-on layer bonded to the substrate body by the bonding layer. A layer sequence forming a thin-film element is deposited on the grown-on layer by epitaxy, the thin-film element being based on a III-V nitride semiconductor material. The thin-film element is joined to a carrier and then the epitaxy substrate is removed from the thin-film element.

According to the invention, it is provided for the radiation-emitting semiconductor chip based on III-V nitride semiconductor material to be formed as a thin-film element.

In this context, the term thin-film element is understood as meaning a sequence of semiconductor layers which consists substantially only of a stack of epitaxy layers based on III-V nitride semiconductor material.

The thin-film element contains a plurality of III-V nitride semiconductor epitaxy layers, the thin-film element being delimited on one side by an n-conducting epitaxy layer and on the opposite side by a p-conducting epitaxy layer.

The p-conducting side of the thin-film element is applied to a conductive carrier, which has a mounting surface for the thin-film element and can preferably be used at the same time to make contact with the thin-film element.

A corresponding contact surface is formed on the n-conducting side of the thin-film element. In the text that follows, the term "contact surface" without further information relates to the contact surface.

A considerable advantage of the semiconductor chip formed in this way is that it does not have an epitaxy substrate of standard thickness (>100 μm), such as for example a SiC substrate, and consequently the materials costs for the semiconductor component are reduced.

A further advantage of the thin-film configuration resides in the fact that the semiconductor body then only includes small residues of a radiation-absorbing substrate or even no longer includes any radiation-absorbing substrate.

Therefore, the radiation yield can be increased by using a reflective carrier.

An advantageous refinement of the invention consists in the epitaxy layer which delimits the thin-film element on the n-conducting side being formed as a conductive buffer layer.

The formation of buffer layers in the fabrication of GaN-based semiconductor bodies is a standard way of compensating for a lattice mismatch between the epitaxy substrate and the epitaxy layers that follow the buffer layer.

The conductive buffer layer brings with it the considerable advantage that the semiconductor body formed in this way can be used to create a vertically conductive semiconductor component.

Compared to insulating buffer layers, this is advantageous since less outlay is involved in making contact with vertically conductive semiconductor chips. Furthermore, a larger lateral extent of the active layers is thereby possible.

In a particularly preferred configuration of the invention, the buffer layer is of multilayer structure. A sequence of a plurality of layers of different compositions advantageously makes it possible to optimize both the conductivity of the buffer layer and the matching to the subsequent GaN-based layers.

In a preferred configuration of the invention, the buffer layer consists of AlGaN-based materials, such as for example $Al_{1-x}Ga_xN$ where $0 \leq x < 1$ and $Al_{1-x-y}In_xGa_yN$ where $0 \leq x < 1$, $0 \leq y < 1$ $x+y<1$.

In this context, it is particularly advantageous for that side of the buffer layer which faces the contact surface to be formed with a low Al content, in order in this way to obtain a buffer layer of good conductivity.

Since the surface quality and the crystalline quality of such layers with a low Al content are low, it is also advantageous for that side of the buffer layer which is remote from the contact surface to be formed with a high Al content. The high Al content increases the surface quality of the buffer layer and achieves good matching to subsequent III–V nitride semiconductor-based layers.

A buffer layer with a low Al content on the side of the contact surface and a high Al content on the opposite side therefore highly advantageously forms a conductive buffer layer with, at the same time, a high surface quality.

According to the invention, to fabricate a radiation-emitting semiconductor element based on III–V nitride semiconductor material, it is provided for the III–V nitride semiconductor-based layers to be applied to an epitaxy substrate, the substrate body of which has a coefficient of thermal expansion which is matched to III–V nitride semiconductor materials or a coefficient of thermal expansion which is greater than that of III–V nitride semiconductor materials, and which is delimited on the epitaxy side by a thin grown-on layer, which preferably contains Si(111).

In this way, the thermal expansion of the epitaxy substrate during fabrication of the III–V nitride semiconductor body is advantageously determined by the substrate body, and consequently the thermal characteristics of the substrate are similar to those of the layers which are to be applied.

An Si(111) surface has a hexagonal structure and is therefore eminently suitable as an epitaxy surface for III–V nitride semiconductor materials.

Furthermore, Si(111) surfaces are easy to machine and prepare for epitaxy. The processing steps for Si(111) are very well known and fully tried-and-tested, on account of the very successful use of this material in the semiconductor industry.

Therefore, it is also advantageously possible to fabricate epitaxy substrates with a diameter which is significantly greater than the diameter of commercially available SiC substrates.

The surface quality of Si(111) surfaces which can be achieved is also well above the surface quality of SiC substrates.

The substrate body used is preferably polycrystalline SiC (PolySiC), GaN or polycrystalline GaN (PolyGaN), on account of the good thermal matching to GaN-based layers. Furthermore, the substrate body may contain sapphire ($\alpha$-$Al_2O_3$), which has a higher coefficient of thermal expansion than III–V nitride semiconductor materials.

These substrate bodies are considerably less expensive than the substrates which have been used according to the prior art, since the semiconductor body is deposited on the surface of the grown-on layer, and in this way the demands imposed on the crystalline properties of the substrate body are advantageously reduced. On account of the reduced demands, it is possible in particular to use inexpensive polycrystalline materials.

The substrate body is preferably joined to the grown-on layer by a bonding layer which consists of silicon oxide or silicon nitride.

It is easy to form a bonding layer between the substrate body and the grown-on layer, and the materials mentioned ensure a particularly stable join.

In a particularly preferred refinement of the fabrication method according to the invention, the method is continued after the application of the III–V nitride semiconductor-based layers by, in a next step, a carrier being applied to the III–V nitride semiconductor-based layers.

Then, the epitaxy substrate is removal from the III–V nitride semiconductor-based layers.

Therefore, reuse or further use of the epitaxy substrate or the substrate body is advantageously possible.

The use of an Si(111) grown-on layer as an epitaxy surface is advantageous when the epitaxy substrate is being removed, since the semiconductor body can easily be removed from the substrate body, for example by etching. The Si(111) grown-on layer in this case represents a sacrificial layer.

In the fabrication method, the possibility of inexpensive fabrication of the semiconductor bodies using a monocrystalline SiC substrate body is particularly advantageous, since the expensive SiC substrate body can be reused or used further.

In a preferred refinement of the fabrication method according to the invention, following the removal of the epitaxy substrate, a contact surface is applied to that surface of the semiconductor body from which the epitaxy substrate has been removed.

An advantageous configuration of the fabrication method according to the invention consists in patterning the plurality of III–V nitride semiconductor layers prior to the removal of the epitaxy substrate.

The term patterning is to be understood as meaning measures that laterally divide the epitaxy layers into a multiplicity of individual epitaxy layer stacks that are disposed next to and at a distance from one another on the epitaxy substrate. If the epitaxy layer stack is removed by etching, the patterning advantageously increases the surface area which is exposed to the etching attack.

In an advantageous refinement of the invention, in the fabrication method described above, instead of a carrier, a temporary carrier is applied to the epitaxy layers based on III–V nitride semiconductor material. Then, the epitaxy substrate is removed again and a carrier is applied to that side of the epitaxy layers from which the epitaxy substrate has been removed. In the next step, the temporary carrier is removed.

This refinement advantageously reverses the layer sequence of the layers based on III–V nitride semiconductor material with respect to the carrier, compared to the fabrication method described above. This reversal is advantageous in order for it also to be possible to employ subsequent methods, in particular encapsulation, which require this reversed layer sequence.

A particularly preferred configuration of the fabrication method according to the invention consists in an electrically conductive buffer layer being the first layer applied to the epitaxy substrate.

A buffer layer of this type is particularly advantageous in order to produce a surface with an optimally matched lattice structure for the subsequent epitaxy layers, which lattice structure is at the same time wetted well by the subsequent layer materials and consequently allows uniform growth of the subsequent layers.

On account of the electrical conductivity of the buffer layer, it is possible to form vertically conductive semiconductor components having the positive properties described above.

It is preferable for the buffer layer to be formed from a plurality of individual layers based on AlGaN.

This is advantageous since a buffer layer with a high Al content forms a lattice-matched surface, with good wetting properties, for further layers based on III–V nitride semiconductor material, but has a low conductivity, while a buffer layer with a low Al content has a good electrical conductivity but a lower crystalline quality and surface quality.

The formation of a plurality of such layers in combination makes it possible to combine a high electrical conductivity with a high crystalline quality.

In this context, it is favorable for a layer with a higher Al content to be formed on the substrate side and a layer with a lower Al content to be deposited toward the epitaxy layers, i.e. on that side of the buffer layer which is remote from the epitaxy substrate.

In a particularly advantageous refinement of the fabrication method according to the invention, the buffer layer is formed in two steps.

In the first step, a plurality of electrically conductive regions are applied to the grown-on layer of the epitaxy substrate. A particularly suitable material for the conductive regions is an InGaN-based material, such as $In_{1-x}Ga_xN$ where $0 \leq x < 1$ and $In_{1-x-y}Al_xGa_yN$ where $0 \leq x < 1$, $0 \leq y < 1$ and $x+y<1$, or GaN.

On account of the tendency of Si and Ga to form domains, in this case a substantially homogeneous arrangement of the conductive regions is achieved.

In a second step, the plurality of electrically conductive regions is covered with a planarizing filler layer, with the spaces between the conductive regions being filled.

A particularly suitable material for this purpose is an AlGaN compound with a high Al content. The buffer layer fabricated in this way is very particularly suitable for the deposition of further layers based on III–V nitride semiconductor material and has a high conductivity.

Other features which are considered as characteristic for the invention are set forth in the appended claims.

Although the invention is illustrated and described herein as embodied in a method for fabricating a radiation-emitting semiconductor chip based on III–V nitride semiconductor, and a radiation-emitting semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
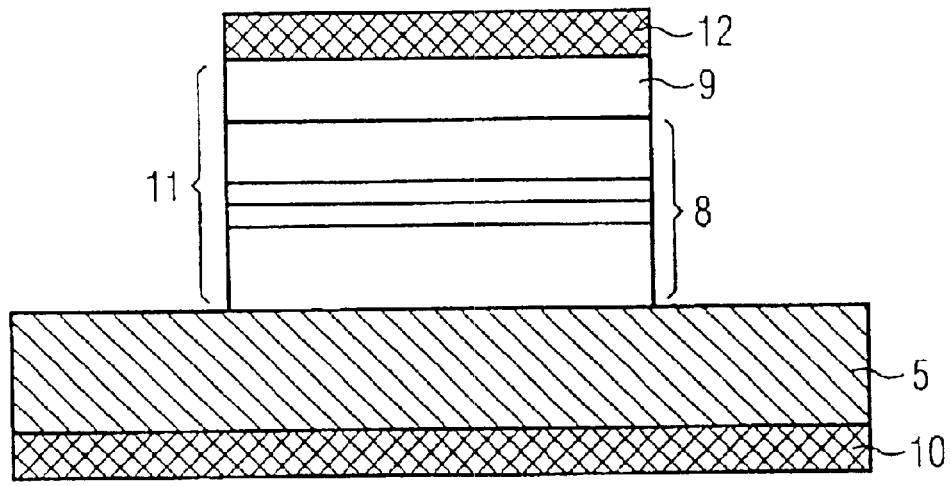
FIG. 1 is a diagrammatic, sectional view of an exemplary embodiment of a component according to the invention.

In all the figures of the drawing, sub-features and integral parts that correspond to one another bear the same reference symbol in each case. Referring now to the figures of the drawing in detail and first, particularly, to FIG. 1 thereof, there is shown a radiation-emitting semiconductor chip that has a semiconductor body 11 in the form of a thin-film element which contains a conductive buffer layer 9 and a layer sequence 8 which includes in particular epitaxy layers based on III–V compound semiconductor material. A contact surface 12 which, contrary to what is illustrated in FIG. 1, may also cover only a part of the top side of the semiconductor body 11 and may, for example, include Al or consist of Al and is configured as a bonding pad, has been applied to the buffer layer 9.

The structure of the layer sequence 8 determines the functionality of the semiconductor body 11 and the chip that it is used to form. The layer sequence 8 also includes the active layer that is used to produce radiation.

The semiconductor body 11 does not have an epitaxy substrate.

The semiconductor body 11 is configured to be n-conducting on the side of the buffer layer 9 and p-conducting on the opposite side.

The p-conducting side of the semiconductor body 11 is applied to a main surface of a conductive carrier 5.

The carrier 5 has a second contact surface 10 on the side which is remote from the semiconductor body 11.

The semiconductor chip formed in this way is advantageously continuously conductive in the vertical direction, i.e. perpendicular to the layer planes. This allows a substantially homogeneous flow of current laterally through the component and also makes it easy to make contact.

A further advantage consists in problem-free chip scaling in the lateral direction. In this context, the term lateral scaling is to be understood as meaning the transition to other lateral dimensions of the chip. This transition is readily possible, since the chip is not patterned in the lateral direction, i.e. does not have any topology in this direction.

By contrast, in the case of laterally patterned components, for example with two different contact surfaces on a main surface, it is necessary to ensure matching of the lateral structure in the event of lateral scaling.

A precondition for a vertically conductive chip is the conductive buffer layer 9. The layer is, by way of example, formed in two-layer form from III–V nitride semiconductor materials. The more precise condition of the buffer layer 9 is explained with reference to FIG. 3, together with the fabrication of the conductive buffer layer 9.

The semiconductor bodies which have been formed in accordance with the invention are particularly suitable for producing light-emitting diode chips with a central wavelength in the yellow, green, green-blue or violet spectral region, light-emitting diodes with a particularly high luminance and for producing semiconductor lasers with an emission wavelength in the green to violet spectral region, on account of the direct band transition and the size of the energy gap of III–V nitride semiconductor materials.

FIGS. 2A–2F diagrammatically depict an exemplary embodiment of a fabrication method according to the invention.

Figure 2A:
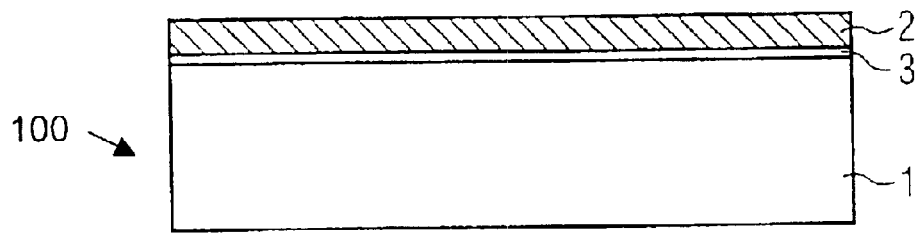
FIGS. 2A–2F are diagrammatic, sectional views depicting method steps for producing the exemplary embodiment according to the invention.

The starting point is formed by a multilayer epitaxy substrate 100 (FIG. 2A). A substrate body 1 consists of SiC, preferably PolySic.

A bonding layer 3, preferably consisting of silicon oxide, which joins the substrate body 1 to a thin grown-on layer 2 which consists, for example, of Si(111), has been formed on the substrate body 1.

The thickness of the grown-on layer 2 is selected to be so small that its thermal expansion is substantially determined by the substrate body 1 below it. The thickness of the grown-on layer 2 is typically between approximately 0.1 $\mu$m and 20 $\mu$m, and is preferably less than 10 $\mu$m and particularly preferably between 0.1 $\mu$m and 2 $\mu$m.

Figure 2B:
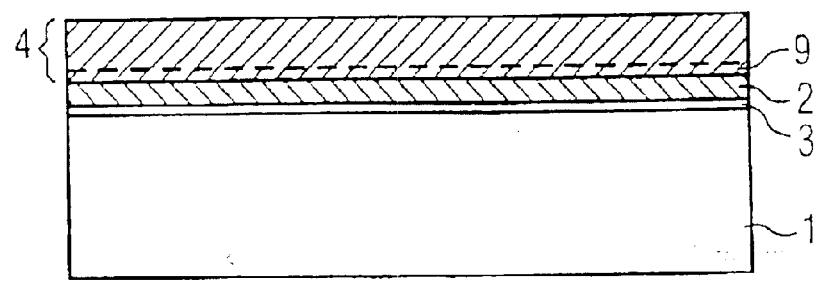

In a subsequent step, a plurality of layers 4 of III–V nitride semiconductor materials is deposited on the surface of the grown-on layer 2, see FIG. 2B.

In this context, it is preferable for the first layer formed on the surface of the grown-on layer 2 to be a conductive AlGaN buffer layer 9, since GaN itself and InGaN compounds have only poor wetting properties for Si(111) or SiC surfaces.

The buffer layer 9 and the adjoining layers based on III–V compound semiconductor material that have been deposited thereon are formed to be n-conducting.

On the opposite side, which is remote from the epitaxy substrate 100, the epitaxy layer stack is delimited by one or more p-conducting layers.

A plurality of $Al_{1-x-y}Ga_xIn_yN$-based layers, where $0 \leq x \leq 1$, $0 \leq y \leq 1$ and $x+y \leq 1$, which are used to generate radiation in the narrower sense, is formed between the n-conducting and p-conducting layers. All radiation-producing semiconductor structures that are known to the person skilled in the art, in particular pn junctions forming a single or double heterostructure and single and multiple quantum-well structures are suitable for this purpose.

Figure 2C:
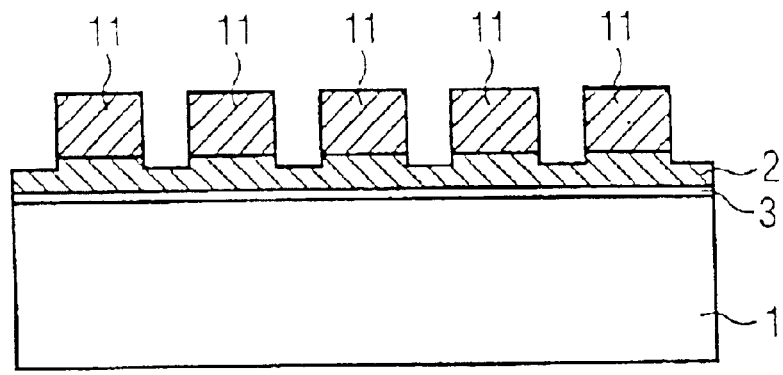
Figure 2D:
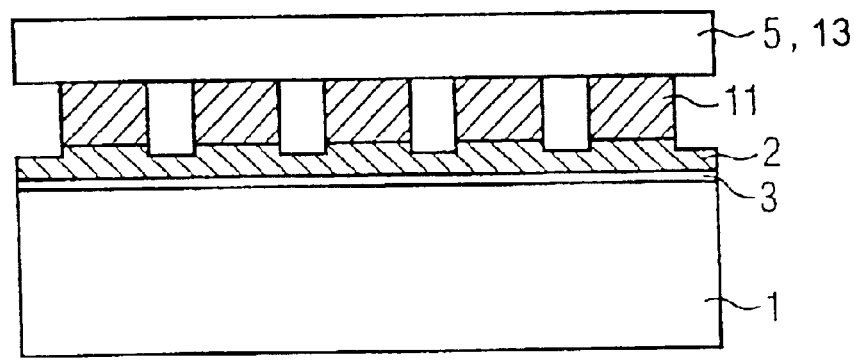

In the next step, the $Al_{1-x-y}Ga_xIn_yN$-based layers 4 are laterally patterned by mesa etching, see FIG. 2C, so that a multiplicity of separate layer stacks disposed next to one another on the epitaxy substrate 100 are formed therefrom. These layer stacks substantially form the as yet undivided thin-film elements 11 of the radiation-emitting chips.

The mesa etching takes place as far as into the grown-on layer 2 of the epitaxy substrate 100, in order, in a subsequent step, to make it easy to remove the thin-film elements 11 from the epitaxy substrate 100.

After the patterning of the $Al_{1-x-y}Ga_xIn_yN$-based layers 4, a carrier 5 or alternatively a temporary carrier 13 is applied to the p-conducting side, which is remote from the epitaxy substrate 100, of the thin-film elements 11. The carrier material used may, for example, be GaAs or Cu.

In the following step (FIG. 2E), the epitaxy substrate 100 is removed from the thin-film element 11. The removal is effected by a wet-chemical process by etching, during which process the grown-on layer 2 is destroyed. The wet-chemical removal in which the grown-on layer 2 is etched away, requires a significantly lower outlay than, for example, the removal of an SiC substrate body.

Alternatively, if the temporary carrier 13 is being used, after the epitaxy substrate 100 has been removed, it is replaced by the carrier 5, after which the temporary carrier 13 is removed.

Figure 2E:
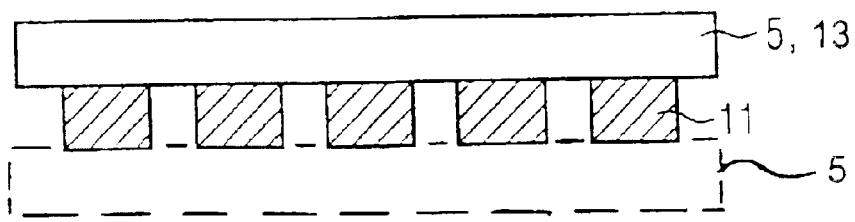

The structures which have been formed at the end of this step are very similar in both alternatives and differ only in the fact that, when the temporary carrier 13 is used, the buffer layer 9 lies on that side of the semiconductor body which faces the carrier 5 (FIG. 2E, right-hand side). In the other case, the buffer layer 9 is formed on that side of the semiconductor body 11 which is remote from the carrier 5.

Figure 2F:
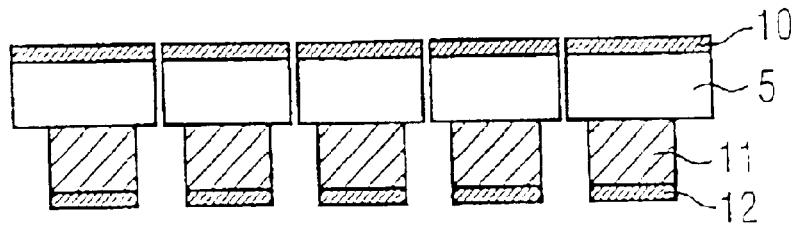

Then, the semiconductor bodies 11 and the carrier 5 are provided with contact surfaces 12 and 10, respectively. Then, the carrier 5 is in each case severed between the semiconductor bodies 11, so that a plurality of the semiconductor chips illustrated in FIG. 1 are formed (FIG. 2F).

The rebonding of the thin-film elements 11 on the carrier 5 or the temporary carrier 13 in connection with the subsequent removal of the epitaxy substrate 100 advantageously allows reuse of the epitaxy substrate body 1, with the result that a considerable cost reduction is achieved if the substrate body material used is SiC.

Furthermore, in this way, all absorption losses occurring in the SiC substrate are eliminated. This leads to a considerably increased radiation yield.

In an alternative fabrication method, it is also possible, when using inexpensive substrate bodies, such as PolySiC or PolyGaN, for the entire substrate to be etched away, if its reuse does not constitute any particular benefit.

FIGS. 3A–3D diagrammatically depict the fabrication of the conductive buffer layer 9.

Figure 3A:
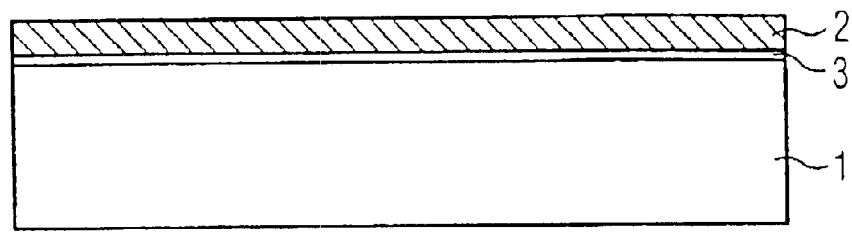
FIGS. 3A–3D are diagrammatic, sectional views depicting a fabrication method according to the invention for a conductive buffer layer.

As in the fabrication method described above, the epitaxy substrate 100 used is an SiC or PolySiC substrate body 1 with the epitaxial grown-on layer 2 which, by way of example, contains Si(111) (FIG. 3A).

Figure 3B:
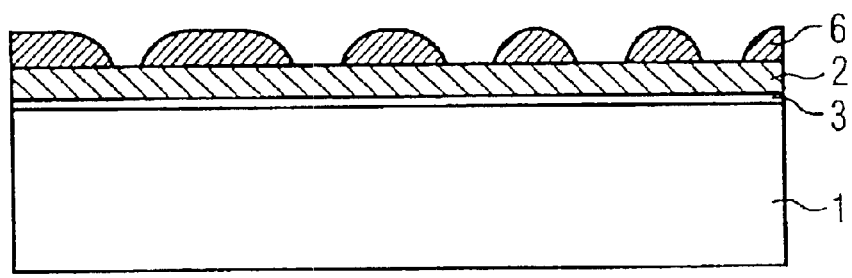
Figure 3C:
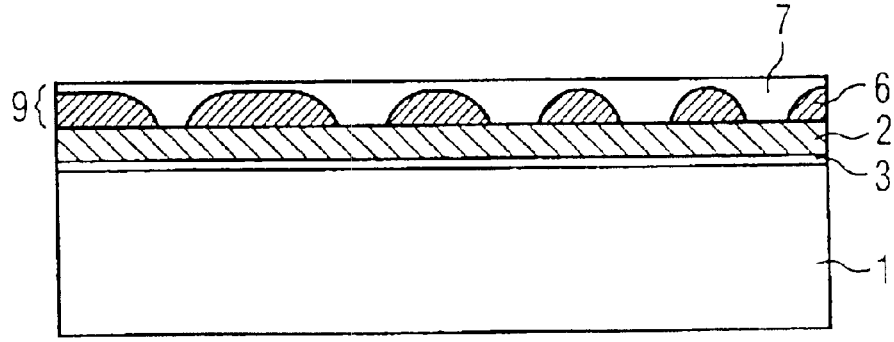
Figure 3D:
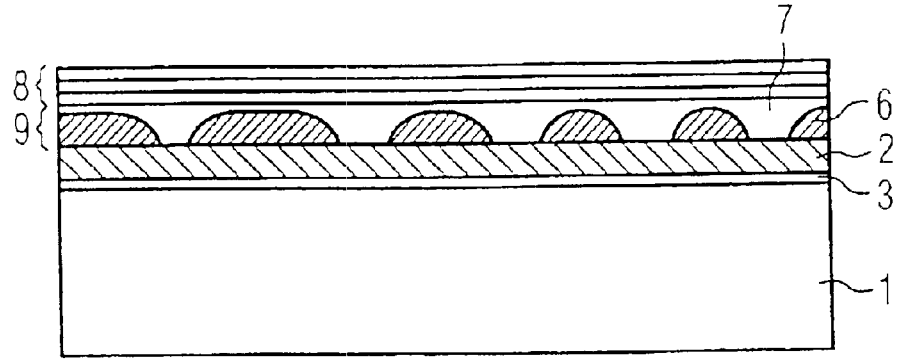

In a first step, a nucleation layer 6 in the form of a plurality of quantum dots is deposited on the grown-on layer 2 (FIG. 3B).

A suitable material for these quantum dots is AlGaInN with a low Al content (<50%), InGaN or GaN. The quantum dots are highly conductive but do not form a continuous layer. Therefore, a plurality of electrically conductive regions that are not continuous with respect to one another is formed on the surface of the grown-on layer. The coverage may vary between 1% and 99%, depending on the composition of the material.

A planarizing filler layer 7 based on AlGaN with a high Al content, for example $Al_xGa_{1-x}N$ where x>0.5, is deposited on the quantum dot layer 6 (FIG. 3C), so that a planar structure 9 is formed.

The conductive regions 6 form channel-like connections through the buffer layer 9 and ensure a good electrical conductivity of the buffer layer 9.

In the next step, the layer sequence 8, which in particular includes epitaxy layers based on III–V compound semiconductor material, is deposited on the buffer layer 9 (FIG. 3D), the layer sequence 8 substantially determines the functionality of the semiconductor component.

The further steps involved in fabrication of thin-film elements and individual semiconductor chips correspond, for example, to the corresponding steps which have been described in connection with FIGS. 2A to 2C.

Of course, the explanation of the invention on the basis of the exemplary embodiments described above does not in any way restrict the invention to these embodiments.

In particular, the compositions of the semiconductor materials can, within the framework indicated, be matched to the particular requirements and the intended field of use of the component.

Furthermore, the central wavelength of the radiation produced can be fixed by the composition of the semiconductor materials within the active layer of the semiconductor body.

We claim:

1. A radiation-emmiting semiconductor chip, comprising:
   a thin-film element having a plurality of layers formed from a III–V nitride semiconductor material, said thin-film element having an n-conducting side and a p-conducting side;
   an electrically conductive carrier, said p-conducting side of said thin-film element applied to said electrically coductive carrier; and
   a contact surface applied on said n-conducting side of said thin-film element, said thin-film element containing a buffer layer being an epitaxy layer adjoining said contact surface, said epitaxy layer formed of an AlGaN-based material and having a first side adjoining said contact surface with a lower Al content than a second side of said epitaxy layer remote from said contact surface, said buffer layer having a plurality of electrically conductive regions made from a different III–V nitride semiconductor material than a remainder of said buffer layer.

2. The semiconductor chip according to claim 1, wherein said plurality of electrically conductive regions is formed from a material selected from the group consisting of an InGaN-based material, InN and GaN.

3. The semiconductor chip according to claim 2, wherein said electrically conductive regions are formed from a material selected from the group consisting of $In_{1-x}Ga_xN$, where $0 \leq x < 1$, and $In_{1-x-y}Al_xGa_yN$, where $0 \leq x < 1$, $0 \leq y < 1$ and $x+y<1$, with an Al content which is so low that said electrically conductive regions are formed.

4. The semiconductor chip according to claim 1, wherein said buffer layer is formed from a plurality of individual layers based on AlGaN.

5. The semiconductor chip according to claim 4, wherein: said thin-film element has a layer sequence adjoining said buffer layer; said plurality of individual layers of said buffer layer includes a first individual layer adjoining said layer sequence, said first individual layer having a higher Al content than a second individual layer following said first individual layer.

6. The semiconductor chip according to claim 1, wherein said carrier transmit or partially transmit radiation produced.

7. The semiconductor chip according to claim 1, wherein said carrier has a layer which reflects radiation produced or at least in part is provided with a surface that reflects the radiation produced.

* * * * *